(12) United States Patent
Dean et al.

(10) Patent No.: US 6,434,704 B1
(45) Date of Patent: Aug. 13, 2002

(54) METHODS FOR IMPROVING THE EFFICIENCY OF CLOCK GATING WITHIN LOW POWER CLOCK TREES

(75) Inventors: Alvar Dean, Essex Junction, VT (US); David C. Garrett; Mircea Stan, both of Charlottesville, VA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/375,118

(22) Filed: Aug. 16, 1999

(51) Int. Cl.[7] ................................................ G06F 1/32
(52) U.S. Cl. ........................................ 713/320; 716/12
(58) Field of Search ................................ 713/322–324, 713/500, 501, 601; 716/1, 2, 8–10, 12

(56) References Cited

U.S. PATENT DOCUMENTS

| | | |
|---|---|---|
| 4,615,005 A | 9/1986 | Maejima et al. |
| 5,452,239 A | 9/1995 | Dai et al. |
| 5,615,376 A | 3/1997 | Ranganathan |
| 5,701,441 A | 12/1997 | Trimberger |
| 5,715,172 A | 2/1998 | Tzeng |
| 5,801,955 A | 9/1998 | Burgun et al. |

*Primary Examiner*—Thomas M. Heckler
(74) *Attorney, Agent, or Firm*—Schmeiser, Olsen & Watts; Mark F. Chadurjian

(57) ABSTRACT

Methods are provided for improving the efficiency of clock gating within low power clock trees. In a first aspect, a correlation level between a plurality of clock gating signals and their corresponding gates which gate a source clock is determined. The clock gating signals and their corresponding gates are combined into a single clock gating signal and a single corresponding gate if a preselected level of correlation exists therebetween. In a second aspect, an area overlap is determined for a plurality of sinks, and one of the gated drovers of the sinks is removed. The sinks of the removed gated driver then are connected to a remaining gated driver driven by a single clock gating signal and a single corresponding gate. In a third aspect, physically proximate sink clusters are rewired to generate a pure clock gating group within each sink cluster if rewiring the clusters increases wiring length by less than a predetermined amount. In a fourth aspect, a clock gating group is selected and the power dissipation is computed for all sinks within the selected group assuming all the sinks therein are wired without clock gating. The power dissipation also is computed assuming all the sinks therein are gated. If the power dissipation for all sinks within the selected group is reduced by individually wiring the sinks therein, the group is ungated. A computer program product also is provided having a computer readable medium with means for performing the first, second, third and/or fourth aspects of the invention.

28 Claims, 14 Drawing Sheets

ClockGate Analysis

⟵ 601

603 { Calculated number of clockgates: 3
57 Vectors analyzed
Writing activity file clock_groups.aet

ClockGate Report

605
| Clock | Activity | %Latches | Usefullness ((1-activity) * (%Latches*100)) |
|---|---|---|---|
| CLKG_A | 0.316 | 0.40 | 27.4 |
| CLKG_B | 0.316 | 0.50 | 34.2 |
| CLKG_C | 0.947 | 0.10 | 0.5 |

Useless CLOCKGATES as defined by threshold: 5

Signal CLKG_C has a usefullness metric of 0.5

Writing Correlation File clock_groups.cor

Correlated CLOCKGATE Groups at threshold: 0.9

GROUP 1 Correlation=
    CLKG_A : activity 0.316
    CLKG_B : activity 0.316

---

CLOCK_GROUPS.COR file

---

Signal Correlation Report

607

|  | CLKG_A | CLKG_B | CLKG_C |
|---|---|---|---|
| CLKG_A | 1.00 | 0.95 | 0.37 |
| CLKG_B | 0.95 | 1.00 | 0.37 |
| CLKG_C | 0.37 | 0.37 | 1.00 |

METHODS FOR IMPROVING THE EFFICIENCY OF CLOCK GATING WITHIN LOW POWER CLOCK TREES

FIELD OF THE INVENTION

The present invention relates to clock distribution circuitry and more particularly to methods for improving the efficiency of clock gating within low power clock trees.

BACKGROUND OF THE INVENTION

In typical microprocessor designs, the clock distribution network or "tree" can consume from 20% to 50% of a microprocessor's total active power. As the clock net is usually the single largest power consuming signal within most microprocessor systems, one important technique for reducing power consumption in microprocessor designs is to reduce the power of a microprocessor's clock distribution tree by breaking up the clock into several separate clocks that can be individually controlled or "gated off" when some portions of the microprocessor do not need to be clocked.

This process, known as "clock gating", disables the clocks fed to logic blocks of the microprocessor when the logic blocks are not currently in use by the microprocessor. Power consumption due to the clocking of logic blocks that are not directly involved with the current operation of the microprocessor thereby is minimized. The clock gating strategy of defining logic blocks that can be clock gated and creating the clock gating control signals that perform the clock gating is typically a manual process that provides little information about the power reduction efficiency of the clock gating.

A problem with clock gating is that it requires additional logic (e.g., clock gating logic) within a microprocessor's instruction decode and control unit to manage the clock gating control signals. In order to have a net power savings, the clock gating logic must consume less power than is saved by gating the clocks off.

The ideal clock distribution tree has the smallest number of clock gates that yield the maximum amount of clock gating power savings when running typical application code. However, analyzing the efficiency of a clock gating strategy on a microprocessor design and modifying the clock gating strategy to reduce clock distribution tree power consumption remains a challenge. Further, typical clock gating strategies ignore the physical design and location of logic blocks that are gated. In certain clock distribution arrangements, ignoring the physical design and layout of gated logic blocks can generate a wiring overhead that consumes more power than is gained by an optimized clock gating strategy. Accordingly, a need exists for methods for improving the efficiency of clock gating within low power clock trees.

SUMMARY OF THE INVENTION

To overcome the needs of the prior art, methods are provided for improving the efficiency of clock gating within low power clock trees. In a first aspect of the invention, a correlation level between a plurality of clock gating signals and their corresponding gates which gate a source clock is determined. The plurality of clock gating signals and their corresponding gates are combined into a single clock gating signal and a single corresponding gate if a preselected level of correlation exists between the plurality of clock gating signals. Preferably a level of usefulness of the plurality of clock gating signals and their corresponding gates also is determined, and the clock source is "ungated" by removing at least one of the corresponding gates if a preselected low level of usefulness exists.

In a second aspect of the invention, an area overlap is determined for a plurality of sinks, each driven by one of at least two gated drivers (which, in turn, are driven by at least a portion of a plurality of clock "driven" gating signals and their corresponding gates), and one of the gated drivers is removed. The sinks of the removed gated driver then are connected to the remaining gated driver driven by a single clock gating signal and a single corresponding gate.

In a third aspect of the invention, the location of sinks and sink clusters within the clock network are identified and physically proximate sink clusters are examined for "common" sinks (e.g., sinks belonging to the same clock gating group or domain). The physically proximate sink clusters then are rewired to generate a pure clock gating group within each sink cluster if re-wiring the clusters increases wiring length by less than a predetermined amount.

In a fourth aspect of the invention, a clock gating group of the clock network is selected and the power dissipation is computed for all sinks within the selected clock gating group assuming all the sinks therein are wired without clock gating. The power dissipation also is computed for all sinks within the selected clock gating group assuming all the sinks therein are gated. If the power dissipation for all sinks within the selected clock gating group is reduced by individually wiring the sinks within the clock gating group, the clock gating group is ungated (e.g., is partitioned into subgroups). Preferably a similar power dissipation analysis/ungating procedure is performed for all clock gating groups within the clock network. The first, second, third and fourth aspects of the invention may be combined or performed separately and/or individually.

A computer program product also is provided for use in designing a clock network. The inventive program product is carried by a medium readable by a computer (e.g., a carrier wave signal, a floppy disc, a hard drive, a random access memory, etc.). The computer readable medium comprises means for performing the first, second, third and/or fourth aspects of the invention.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

FIG. 6 is an exemplary clock gating report generated by the clock gating methodology of FIG. 4 based on the microprocessor design of FIG. 1;

DETAILED DESCRIPTION OF THE PREFERRED EMBODIMENTS

Figure 1:
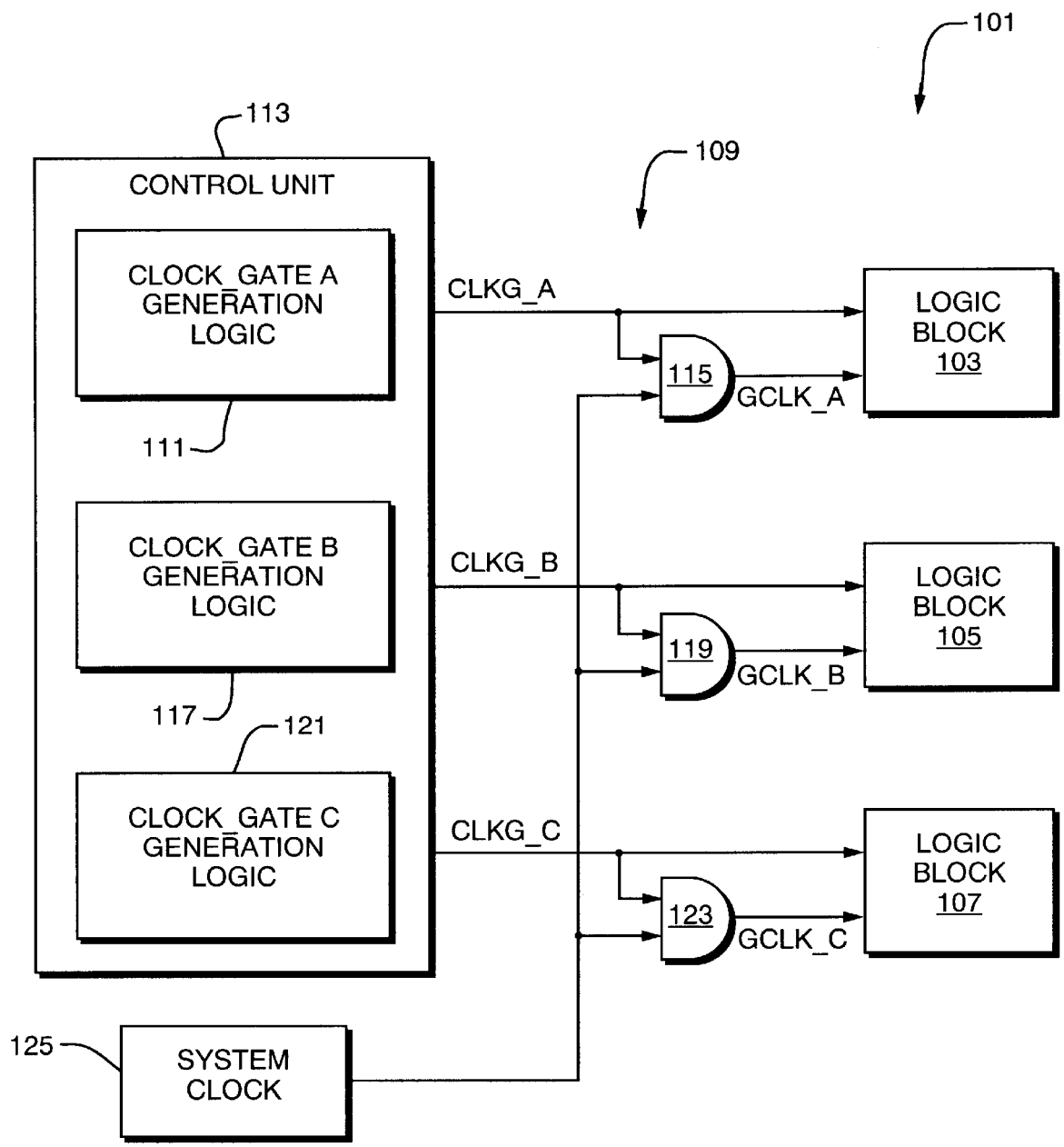
FIG. 1 is a schematic diagram of an exemplary non-optimized clock-gated microprocessor design.

FIG. 1 is a schematic diagram of an exemplary non-optimized clock-gated microprocessor design 101. The microprocessor design 101 comprises three main logic blocks 103–107 coupled to a clock distribution network 109. The clock distribution network 109 comprises a first set of control unit logic 111 (from a control unit 113 of the microprocessor design 101) coupled to a first AND gate 115 and to the first logic block 103, a second set of control unit logic 117 coupled to a second AND gate 119 and to the second logic block 105, and a third set of control unit logic 121 coupled to a third AND gate 123 and to the third logic block 107. The first, second and third AND gates 115, 119 and 123 also are coupled to a system clock 125 of the microprocessor design 101 and to the logic blocks 103–107 as shown.

Figure 3:
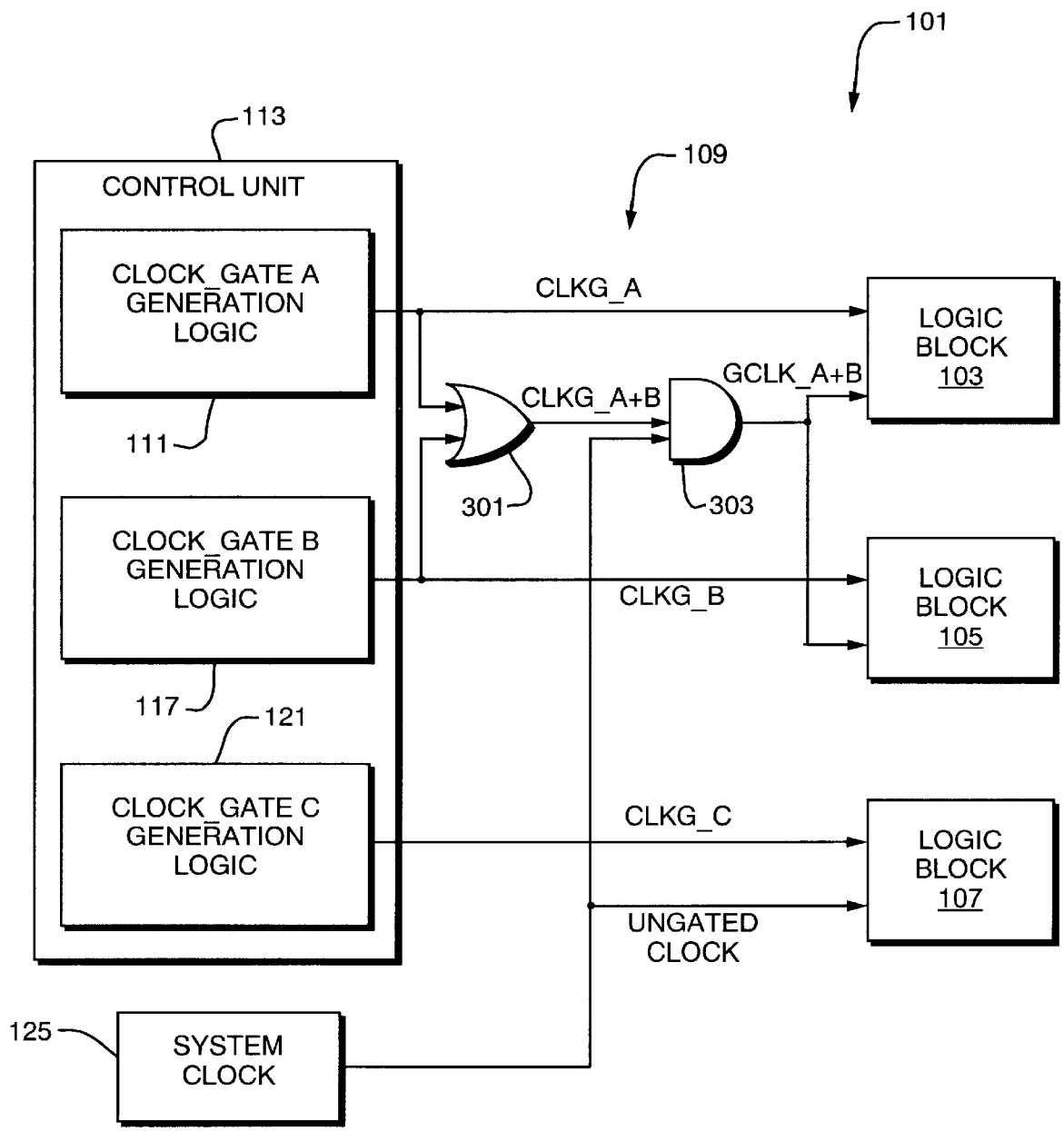
FIG. 3 is a schematic diagram of the microprocessor design of FIG. 1 employing a single set of control unit logic and a single AND gate to generate a composite gated clock.

In operation, the system clock 125 supplies a system clock (SCLK) to the first, second and third AND gates 115, 119 and 123. To minimize power consumption of the first logic block 103, the first set of control unit logic 111 supplies a first clock gating signal (CLKG_A) to the first AND gate 115 that gates the system clock (SCLK) when the first logic block 103 is not in use, and to the first logic block 103 for functional operation thereof. A first gated clock (GCLK_A) thereby is produced that clocks the first logic block 103 and that is individually controllable via the first set of control unit logic 111. Similarly, to minimize power consumption of the logic blocks 105–107, the second set of control unit logic 117 supplies the second AND gate 119 a second clock gating signal (CLKG_B) that gates the system clock (SCLK) when the second logic block 105 is not in use, and that allows functional operation of the second logic block 105, and the third set of control unit logic 121 supplies the third AND gate 123 a third clock gating signal (CLKG_C) that gates the system clock (SCLK) when the third logic block 107 is not in use, and that allows functional operation of the third logic block 107. A second gated clock (GCLK_B) and a third gated clock (GCLK_C) thereby are produced that clock the second logic block 105 and the third logic block 107, respectively, and that are individually controllable. Note that it is a primary objective of the present invention to remove and combine clock distribution gating logic such as the AND gates 115, 119 and 123 to reduce power consumption. The control unit logic 111, 117 and 121 must remain and feed clock gating signals to the logic blocks 103–107 for functional operation thereof (as shown in FIG. 3).

Figure 2:
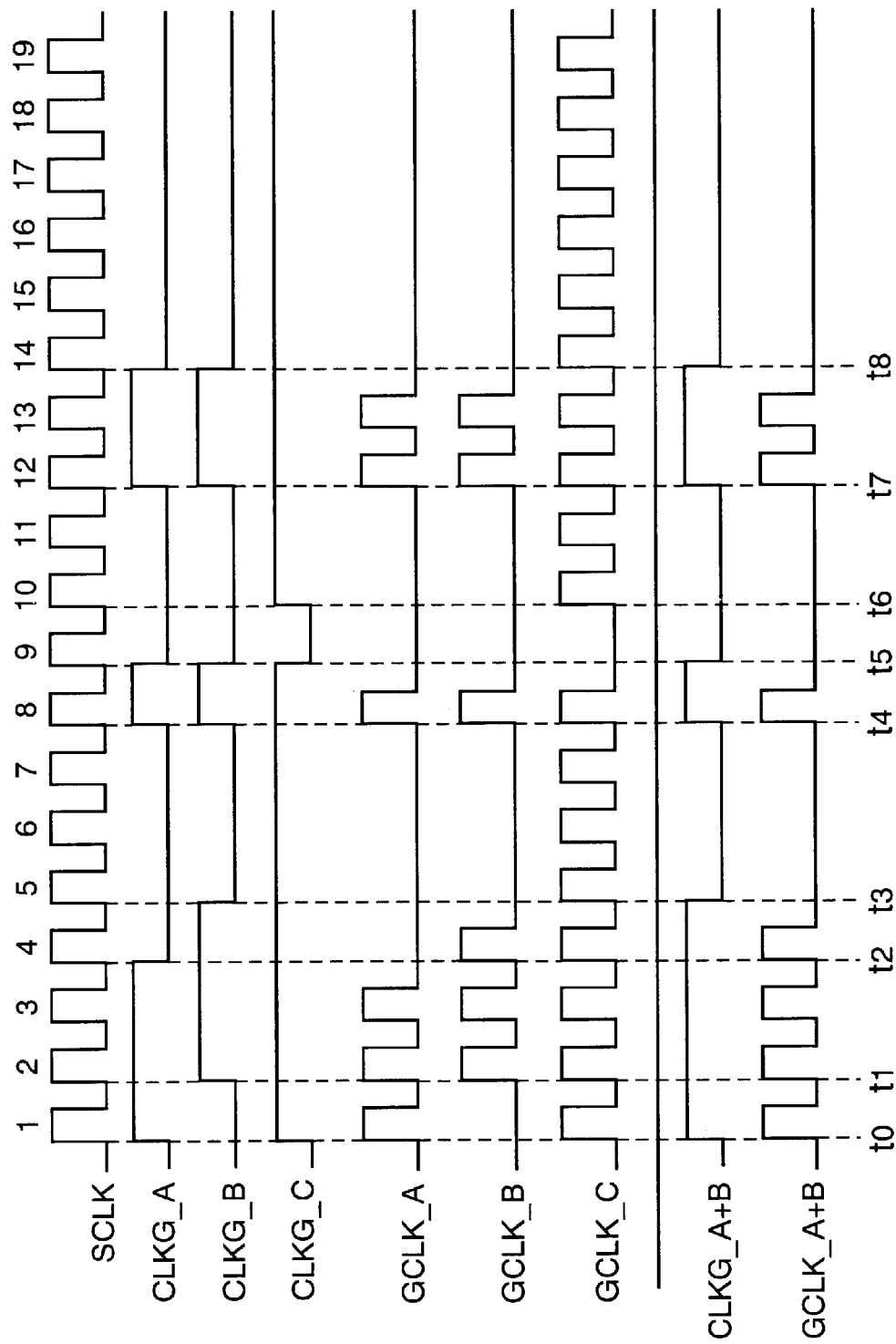
FIG. 2 is an exemplary timing diagram for the various clocking waveforms of the microprocessor design of FIG. 1.

FIG. 2 is an exemplary timing diagram 201 for the various clocking waveforms of the microprocessor design 101 of FIG. 1. Specifically, the timing diagram 201 illustrates exemplary waveforms for the system clock (SCLK), the first, second and third clock gating signals (CLKG_A), (CLKG_B) and (CLKG_C), and the first, second and third gated clocks (GCLK_A), (GCLK_B) and (GCLK_C).

With reference to FIG. 2, the first clock gating signal (CLKG_A) and the second clock gating signal (CLKG_B) are very similar. The differences between the first and the second clock gating signals (CLKG_A), (CLKG_B) occur between times $t_0$ and $t_1$, wherein the first clock gating signal (CLKG_A) is high and the second clock gating signal (CLKG_B) is low, and between times $t_2$ and $t_3$ wherein the first clock gating signal (CLKG_A) is low and the second clock gating signal (CLKG_B) is high. The third clock gating signal (CLKG_C) is only similar to the first or the second clock gating signals (CLKG_A), (CLKG_B) between times $t_0$ and $t_3$ and between times $t_5$ and $t_6$.

Because of the high degree of similarity between the first and the second clock gating signals (CLKG_A), (CLKG_B), the two clock gating signals may be combined into a composite clock gating signal (CLKG_A+B) that results in a composite gated clock (GCLK_A+B) as shown in FIG. 2. In this manner, the first AND gate 115 and the second AND gate 119 may be replaced with a single AND gate (as described below with reference to FIG. 3) with only a slight loss in clock gating efficiency for the first logic block 103 and the second logic block 105. A net reduction in power consumption for the microprocessor design 101 thereby is achieved.

Additional power consumption savings may be affected by modifying the third clock gating signal (CLKG_C). With reference to FIG. 2, the third clock gating signal (CLKG_C) is high over 90% of the time period shown. Accordingly, the third gated clock (GCLK_C) is almost always active. Assuming the third logic block 107 represents only about 10% of the logic circuitry of the microprocessor design 101, the use of the third AND gate 123 so as to generate the third gated clock (GCLK_C) consumes more power than allowing the system clock (SCLK) to clock the third logic block 107 directly. Thus, the third AND gate 123 preferably is eliminated.

FIG. 3 is a schematic diagram of the microprocessor design 101 employing an OR gate 301 to combine the first and the second clock gating signals (CLKG_A), (CLKG_B) to form the composite clock gating signal (CLKG_A+B), and a single AND gate 303 coupled to the OR gate 301 so as to generate the composite gated clock (GLKC_A+B) for both the first logic block 103 and the second logic block 105, and employing no clock gating for the third logic block 107. By thus eliminating the third AND gate 123 and by replacing the first AND gate 115 and the second AND gate 119 with the single AND gate 303, the power consumption of the microprocessor design 101 is reduced despite a slight loss in clock gating efficiency. More importantly, fewer clock-gating domains are required so that a simpler and lower power clock tree results.

Note that it may not be possible to eliminate components 117–123 if clock gating is required for proper operation of the microprocessor design 101. In such instances, clock gating should still be performed at the splitter or leaves of the clock tree, but gating at the root and middle branches of the tree may be simplified.

Figure 4:
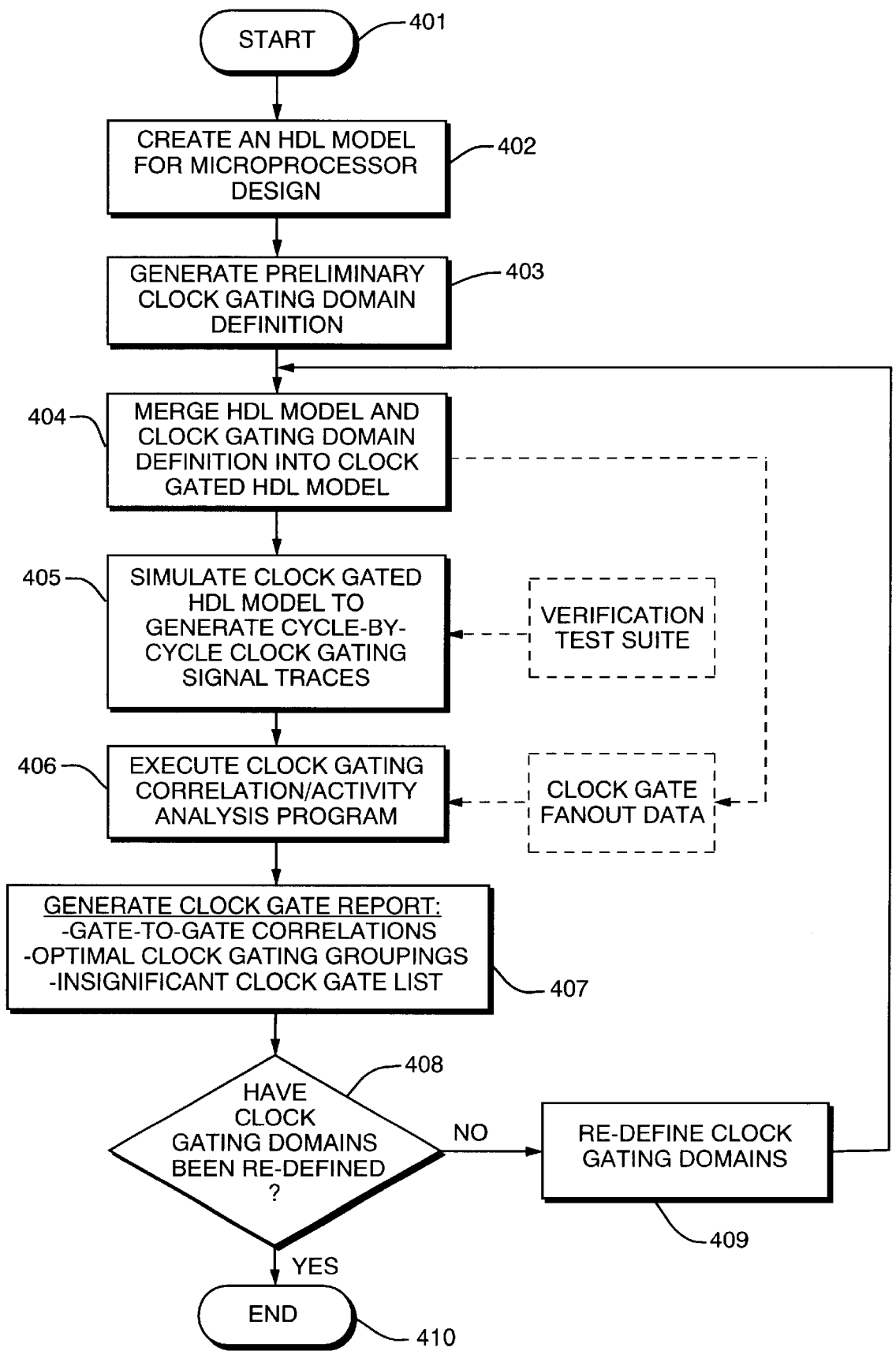
FIG. 4 is a flowchart of an inventive clock gating methodology for improving the clock gating efficiency of low power clock distribution networks.

FIG. 4 is a flowchart of an inventive clock gating methodology 400 for improving the clock gating efficiency of low power clock distribution networks. For example, the clock gating methodology 400 may be used to generate the reduced power consumption microprocessor design 101 of FIG. 3 based on the original design of FIG. 1.

The clock gating methodology 400 starts at step 401. In step 402, a high-level design language (HDL) model of a microprocessor design is created. Any suitable HDL model may be employed, such as Verilog® by Cadence Design Systems, Inc. or VHDL. A preliminary definition of clock gating domains (e.g., clock gating for the logic blocks 103–107 of FIG. 1) then is generated in step 403. The preliminary clock gating domain definition process typically is performed manually, based on logic block functionality, by an engineer having knowledge of the microprocessor architecture. In step 404, the HDL model of the microprocessor design and the preliminary definition of clock gating domains are merged into a clock gated HDL model for the microprocessor design.

In step 405, the clock gated HDL model for the microprocessor design is simulated in a logic simulator (e.g., Verilog® XL by Cadence Design Systems, Inc.) with real vectors representative of the operating environment of the design. A verification test suite may be used for this purpose (e.g., various functional patterns or simulation vectors which together comprise a representative sample of typical operating instructions or programs that are likely to execute on the microprocessor). The outputs of the logic simulation of the clock gated HDL model for the microprocessor design are cycle-by-cycle traces of all the microprocessor's clock gating signals.

In step 406, the cycle-by-cycle clock gating signal traces output by the logic simulator and clock gate fanout data (e.g., the number of loads that a net drives) from the original clock gated HDL model for the microprocessor design are passed to a clock gating correlation/activity analysis program. Therein, to assess the effectiveness of the microprocessor design's clock distribution network, primarily three factors are considered for each clock gating signal:

1. the clock gating signal's activity (e.g., the percentage of time the clock gating signal gates off the system clock);
2. the percentage of latches controlled by the clock gating signal; and
3. the cross-correlation of the clock gating signal with all other clock gating signals within the clock distribution network.

By analyzing each of the clock distribution network's clock gating signals, clock gating signals that produce little gating and which are inefficient may be eliminated and similar clock gating signals may be combined into one clock gating signal as described below.

The clock gating correlation/activity analysis program begins by parsing the cycle traces of the clock gating signals and by calculating the activity ratio for each signal. The activity ratio for a clock gating signal is determined by calculating the ratio of the on-time of the clock gating signal (e.g., the time when the system clock is not gated-off by the clock gating signal) to the entire simulation time.

Figure 5:
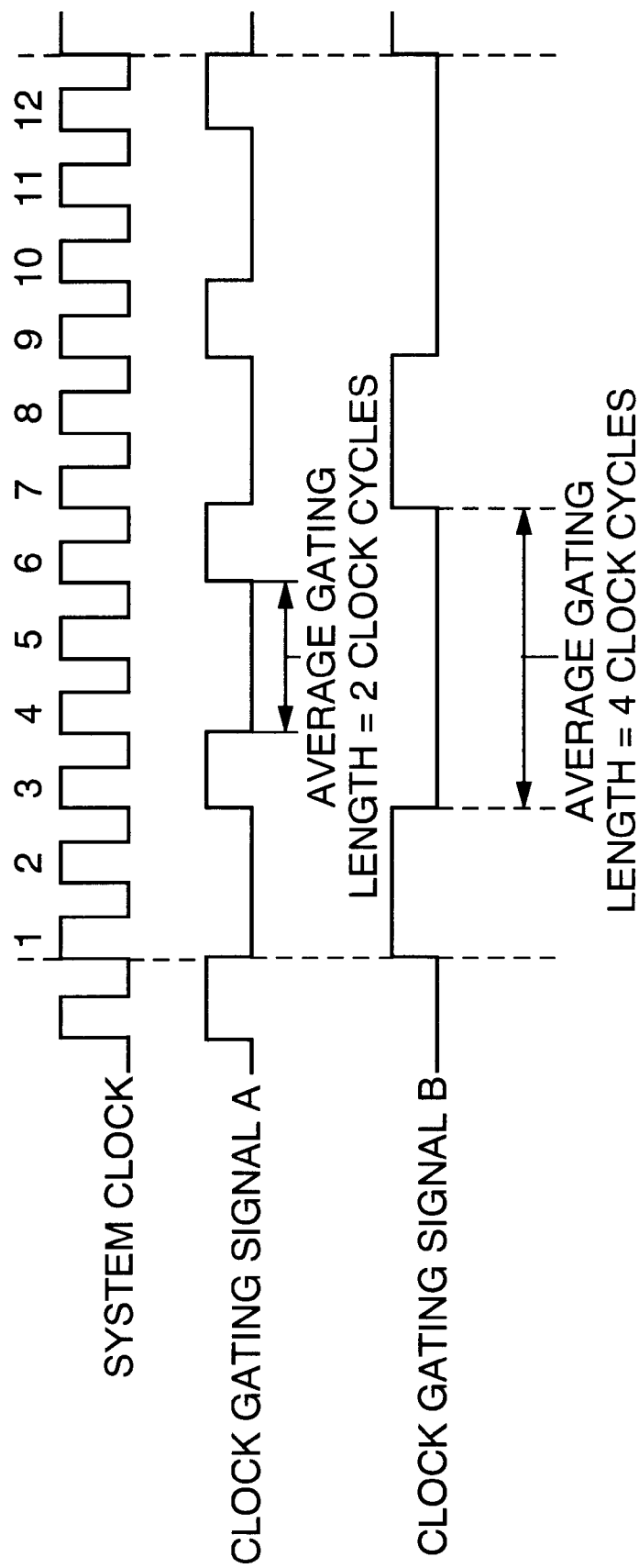
FIG. 5 is an exemplary timing diagram for a system clock and clock gating signals useful in explaining average gating length.

In addition to the activity ratio, preferably the average gating length also is computed, for each clock gating signal. Average gating length is the average length, in clock cycles, that a clock gating signal gates off the clock out of the entire simulation period. For example, FIG. 5 shows exemplary system clock and clock gating signals (e.g., clock gating signal A and clock gating signal B) useful in explaining average gating length. With reference to FIG. 5, both clock gating signals A and B have the same activity ratio between times $t_0$ and $t_1$, because both clock gating signals will gate 8 out of 12 clock cycles of the system clock and will pass 4 out of 12 clock cycles of the system clock. However, because clock gating signal B switches half as many times as clock gating signal A (e.g., clock gating signal B has an average gating length that is twice as long as clock gating signal A's average gating length), the gating due to clock gating signal B can be done with fewer gating logic switches. More specifically, the average gating length for clock gating signal A ($AGL_A$) equals:

$$AGL_A = \frac{2+2+2+2}{4 \text{ TIMES}} = 2$$

and for clock gating signal B ($AGL_B$) equals:

$$AGL_B = \frac{4+4}{2 \text{ TIMES}} = 4.$$

Accordingly, less power is required to implement gating with clock gating signal B than with clock gating signal A. All other factors being equal, clock gating signal A should be eliminated before clock gating signal B based on average gate length considerations to maximize power consumption savings.

Following the activity ratio and/or average gating length calculations, a forward trace is performed for each clock gating signal to determine the percentage of latches out of the total number of latches in the microprocessor design that are controlled by the clock gating signal (i.e., the latch percentage). By combining the activity ratio (and/or the average gating length) and the latch percentage for each clock gating signal, a clock gating signal "usefulness ratio" for each of the clock distribution network's clock gate signals is determined.

All clock gating signals having a usefulness ratio lower than a pre-determined ratio (e.g., about 10%) preferably are designated as unnecessary clock gating signals and the AND gates required to generate the gated clocks therefrom (e.g., the third AND gate 123 of FIG. 1) should be eliminated, if possible, from the clock distribution network, or clock gating at the root and middle levels of the tree should be simplified. For example, a clock gating signal that is only active 10% of the time but that controls 40% of the microprocessor design's latches is more useful than a clock gating signal that is active 20% of the time but that controls only 1% of the microprocessor design's latches.

After determining the usefulness ratio for each clock gating signal, the clock gating correlation/activity analysis program performs a cross-correlation calculation between all the clock gating signals of the clock distribution network. A matrix of cross-correlations thereby is generated wherein each element in the matrix contains the percentage of time two clock gating signals are identical. The cross-correlation matrix preferably comprises an exhaustive list of all possible comparisons between two clock gating signals of the clock distribution network of the microprocessor design.

When the percentage of time two clock gating signals are identical exceeds a predetermined threshold (e.g., 90%), the two clock gating signals are declared essentially equivalent and preferably are combined into one composite clock gating signal (as described below). For example, with reference to FIG. 2, the first and the second clock gating signals (CLKG_A), (CLKG_B) are identical for 18 out of 19 system clock (SCLK) cycles, and therefore have a cross-correlation percentage of 95%. However, the first and the third clock gating signals (CLKG_A), (CLKG_C), while identical for 6 out of the 19 system clock (SCLK) cycles, would only gate one out of the 19 clock cycles if combined, and have a cross-correlation percentage of 37%.

Accordingly, the first and the second clock gating signals (CLKG_A), (CLKG_B) should be combined while the first and the third clock gating signals (CLKG_A), (CLKG_C) should not be combined.

Once cross-correlation factors are generated for all the clock gating signals, "clock gating groups" are generated. Each clock gating group comprises two or more clock gating signals that have a cross-correlation percentage greater than a predetermined threshold (e.g., 90%). As the size of each clock gating group increases, the number of required clock gating groups decreases and the simpler the clock distribution network becomes (e.g., requiring less control unit logic and fewer AND gates so as to affect a smaller chip area and less power consumption for the microprocessor design). The simpler tree also will be easier to route and thus will consume less power.

After the clock gating correlation/activity analysis program is completed, a clock gating report is generated in step 407 as described below with reference to FIG. 6. Thereafter, the clock gating methodology 400 may end in step 410, but preferably, in step 408, a determination is made as to whether the clock gating domains have been redefined. If not, in step 409, the clock gating domains are automatically redefined based on the clock gating report to improve the efficiency of the clock distribution network. Steps 404–406 then are repeated to analyze a clock gated HDL model embodying the re-defined clock gating domains. A new clock gating report is generated in step 407 and the clock gating methodology 400 ends in step 410.

FIG. 6 is an exemplary clock gating report 601 generated by the clock gating methodology 400 of FIG. 4 based on the microprocessor design 101 of FIG. 1. The clock gating report 601 comprises a general report information section 603 that lists general information such as the number of clock gating signals (e.g., 3), the number of vectors analyzed (e.g., 57) and a file name for storing activity information (e.g., clock-group.act). The clock gating report 601 further comprises an analysis section 605 that provides the activity ratio, the latch percentage and the usefulness ratio for each clock gating signal (CLKG_A), (CLKG_B) and (CLKG_C) of FIG. 2. Preferably the average gating length also is listed (not shown). The predetermined usefulness ratio threshold (below which a clock gating signal is designated as not useful) is shown to be "5" within the analysis section 605 of FIG. 6, and the third clock gating signal (CLKG_C) is displayed as a clock gating signal having a usefulness ratio threshold below the predetermined usefulness ratio threshold (e.g., the third clock gating signal (CLKG_C) preferably is eliminated).

The clock gating report 601 also comprises a correlated clock gating group section 607 that identifies a file name for storing clock gating group information (e.g., clock-groups.cor), the minimum percentage of time two clock gating signals must be identical to be placed within a clock gating group (e.g., 0.9) and the identity of any clock gating signals that can be placed within a single clock gating group (e.g., the first and the second clock gating signals (CLKG_A), (CLKG_B)). The correlated clock gating group section 607 also comprises a correlation matrix 609 that contains the percentage of time each clock gating signal is identical to every other clock gating signal within the clock distribution network.

By employing the clock gating report 601, an engineer can identify which clock gating signals should be combined and which clock gating signals should be eliminated to optimize the efficiency of a clock distribution network. The smallest number of clock gates thereby may be employed that yield the maximum amount of clock gating power savings (i.e., the microprocessor design may be clock gate signal optimized).

While the clock gating methodology 400 of FIG. 4 identifies which clock gating signals should be combined and which should be eliminated, a process is still required that ensures the remaining clock gating groups deliver the best physical layout for the clock distribution network ("clock tree") based on the placement of the latches and clock-splitters that comprise the clock tree (e.g., to achieve a good balance between the clock gating and the wiring capacitance of the clock tree). Failure to consider the physical layout of a clock tree can result in a heavily clock gated design that consumes more power than a clock tree employing no clock gating (e.g., due to capacitive wiring losses associated with the heavily clock gated design as described below with reference to FIGS. 7–11).

Figure 7:
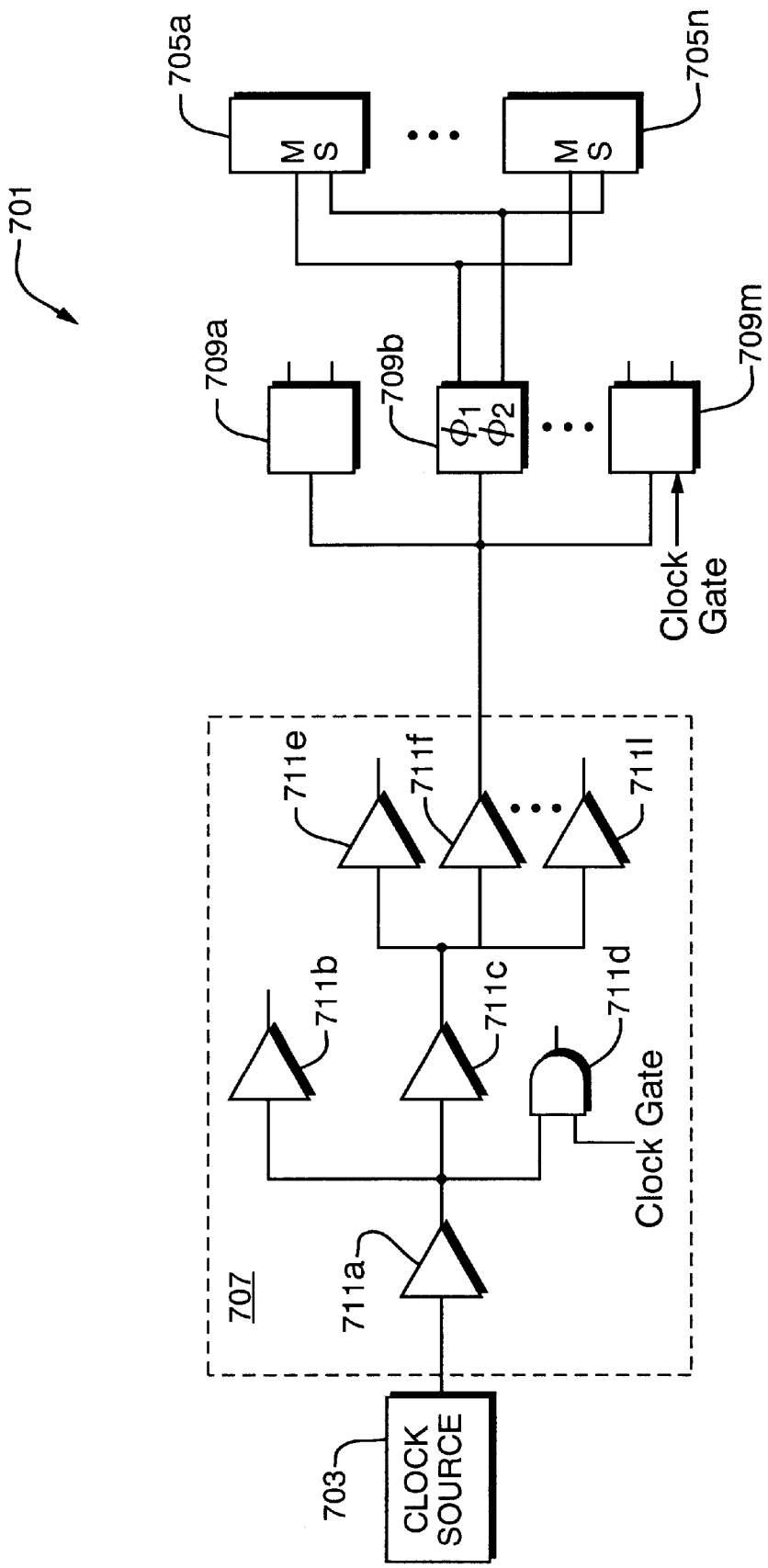
FIG. 7 is a schematic diagram of a typical clock tree.

FIG. 7 is a schematic diagram of a typical clock tree 701. The clock tree 701 comprises a clock source 703 (e.g., a crystal oscillator) coupled to a plurality of latches 705a–n via a repowering tree 707 and, depending on the type of latches being driven, via a plurality of clock splitter circuits ("clock splitters") 709a–m. The repowering tree 707 comprises a plurality of clock buffers 711a–l (as shown) amongst which all the clock loads are distributed. Each clock buffer 711a–l may comprise a standard clock buffer (e.g., clock buffers 711a–c or 711e–l) or a gated clock buffer (e.g., clock buffer 711d) that serves both the functions of re-driving a clock network and of logical clock gating.

In operation, the clock source 703 supplies a clock to the repowering tree 707, and the clock buffers 711a–l of the repowering tree 707 distribute all the clock loads required of the plurality of clock splitters 709a–m and/or of the plurality of latches 705a–n (e.g., so as not to violate the electrical drive limitations of the clock source 703). Depending on the type of clock being distributed, the repowering tree 707 either can drive the plurality of latches 705a–n directly (for a single phase clock tree not shown) or can drive clock splitters such as the plurality of clock splitters 709a–m which generate dual, out of phase clocks to drive master/slave latches such as the plurality of latches 705a–n (for a dual phase clock tree such as the clock tree 701). Standard, single-phase, clock driven edge-triggered flip flops for use in single phase clock trees are well-known in the art and therefore are not described further herein. The plurality of latches 705a–n preferably comprise level sensitive master/slave latches as are known in the art. Clock gating may be performed at any stage of the clock tree 701, from the first buffer 711a to the plurality of clock splitters 709a–m at the "leaves" of the clock tree 701.

Figure 8:
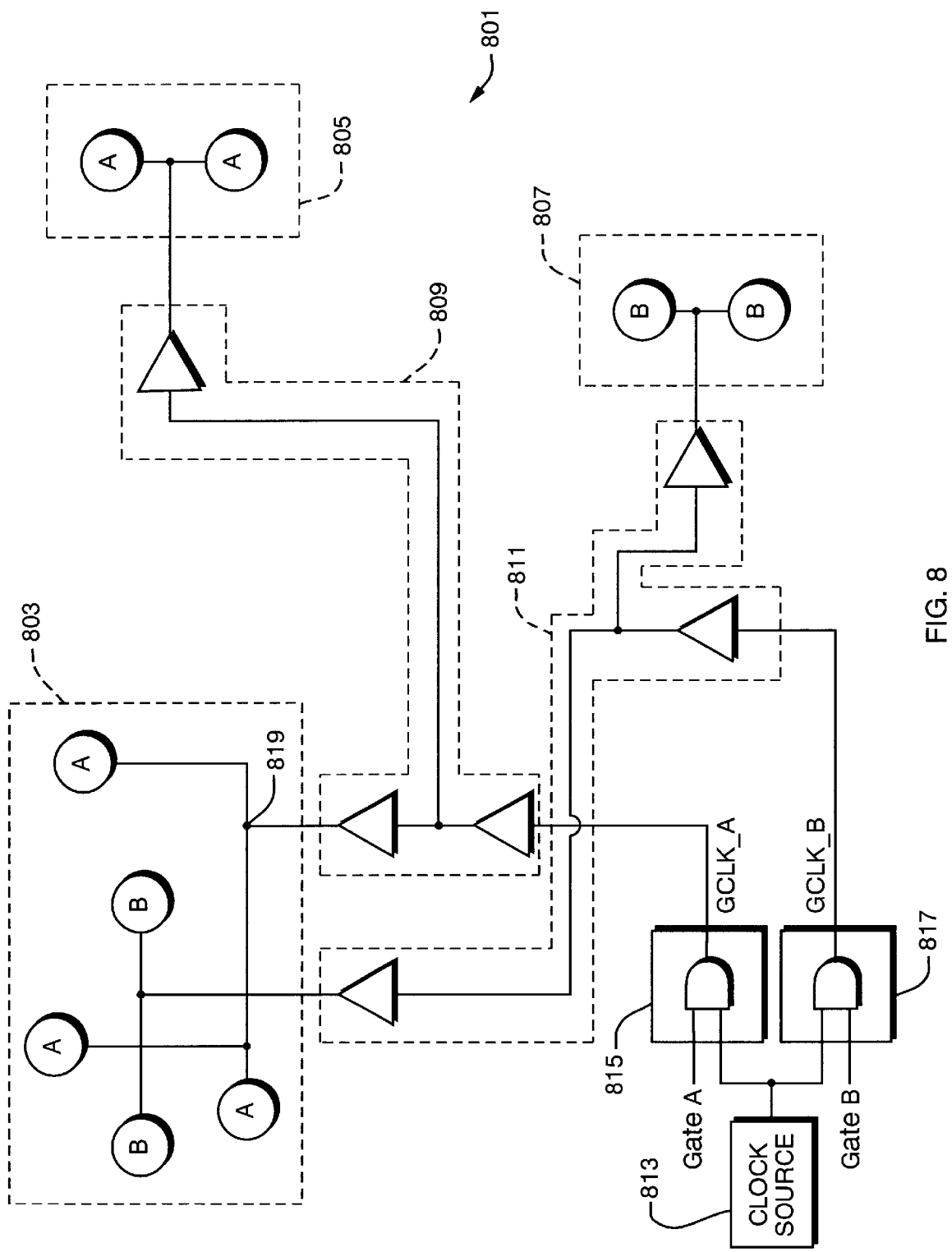
FIG. 8 is a schematic diagram of a sample clock tree employing clock gating which causes long network wiring lengths.

Because the physical location of the clock gates and/or latches are unknown during the logic design stage of a clock tree such as the clock tree 701 (e.g., during the clock gating design previously described with reference to FIGS. 1–6), a clock tree may yield low power consumption due to extensive clock gating based on logic model considerations that typically assume unit capacitance for all clock network wiring connections. However, when real capacitances are extracted from the physical design of the clock tree, the wiring lengths required to implement the clock tree and its associated clock gating may consume more power than that saved by the extensive clock gating. For example, FIG. 8 is a schematic diagram of a sample clock tree 801 employing clock gating which, due to the physical location of drivers and latches, causes long network wiring lengths and thus large capacitive power losses. The clock tree 801 comprises "clusters" of physically proximate sinks (e.g., latches or splitters) on an IC chip represented by reference numbers 803, 805 and 807, respectively. Sinks denoted by "A" represent sinks that are to be gated by a clock gating signal "GATE_A" based on logic model considerations and are therefore said to belong to a clock gated domain A. Sinks denoted by "B" belong to a clock gated domain B. By definition, the gated clock for sinks A (GCLK_A) and the gated clock for sinks B (GCLK_B) are different and must be driven by separate repowering trees. According, the sinks A are driven by a first repowering tree 809 and the sinks B by a second repowering tree 811. Gated clocks for the sinks A and B are supplied from a clock source 813 gated with the clock gating signal GATE_A via gating logic 815 and gated with the clock gating signal GATE_B via gating logic 817, respectively.

The clock tree 801 is inefficient from a power consumption standpoint because of the overlap of the first repowering tree 809 and the second repowering tree 811 in the vicinity of the cluster 803. Because of this overlap, wire connections are required to the cluster 803 from both the GATE_A gating logic 815 and the GATE_B gating logic 817, unlike the cluster 805 and the cluster 807 which require only one wire connection from either the GATE_A gating logic 815 or from the GATE_B gating logic 817 as shown.

Figure 9:
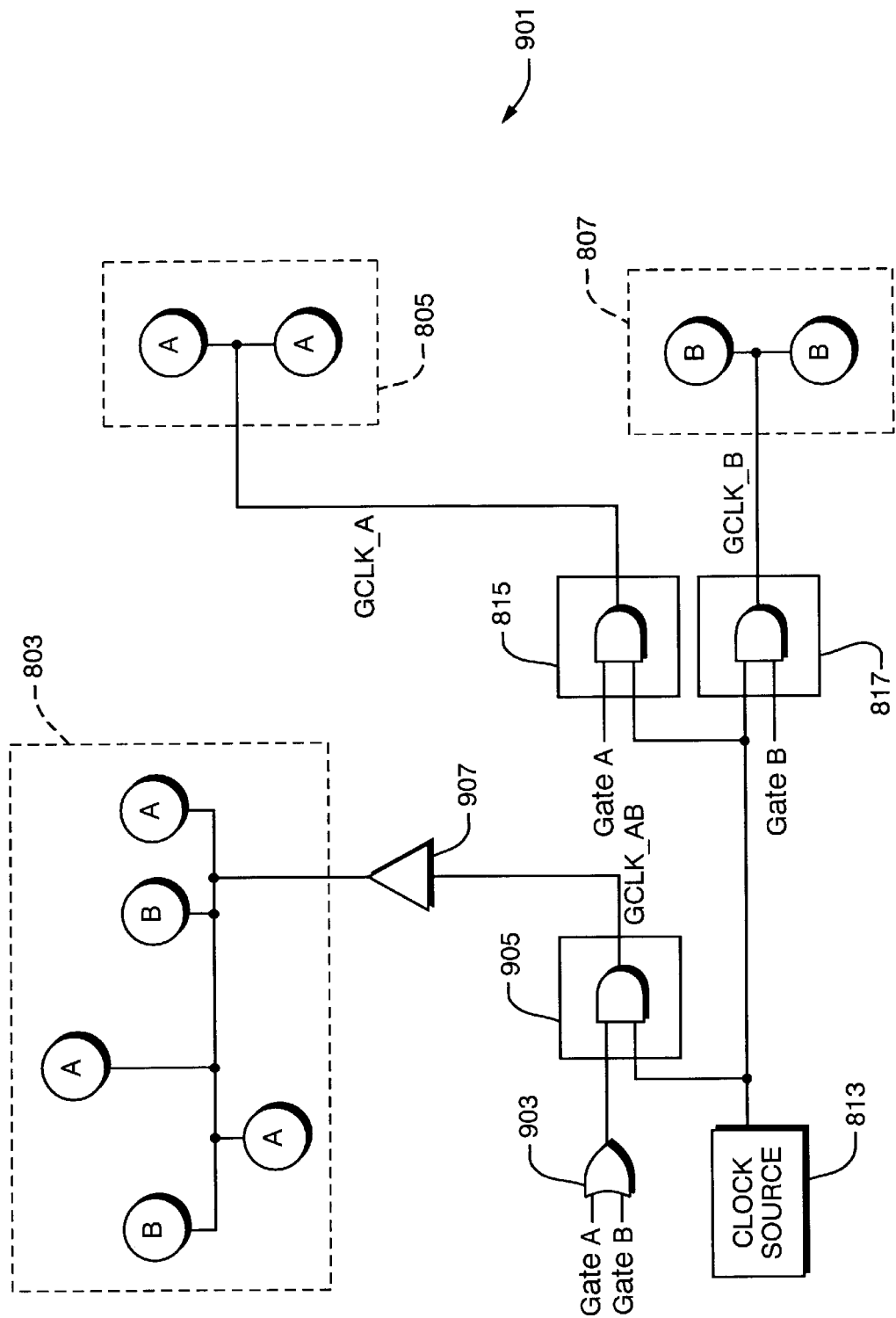
FIG. 9 is a schematic diagram of a clock tree that represents an improvement of the clock tree of FIG. 8.

FIG. 9 is a schematic diagram of a clock tree 901 that represents an improvement of the clock tree 801 of FIG. 8. The clock tree 901 comprises the cluster 803, the cluster 805, the cluster 807, the clock source 813 and the GATE_A, GATE_B gating logic 815, 817 of FIG. 8, as shown. However, the cluster 803 is reorganized so that the sinks A and B within the cluster 803 are driven by a single gated clock "GCLK_AB". The gated clock GCLK_AB is generated by ORing the GATE_A and GATE_B clock gating signals via an OR gate 903 and by gating the clock signal supplied from the clock source 813 with the ORed GATE_A and GATE_B clock gating signals via gating logic 905. A repowering buffer 907 is required to drive all of the sinks A and B within the cluster 803 of FIG. 9.

By employing a single gated clock, a significant decrease in wiring length is achieved as only one wiring connection must be made to the cluster 803. Assuming the power consumption savings due to the reduced wiring length within the clock tree 901 exceeds the power consumption savings of having the sinks A and the sinks B within the cluster 803 separately clock gated as in the clock tree 801, the clock tree 901 represents a more efficient clock tree design than the clock tree 801. Therefore, the goal of considering the physical layout in clock gating optimization is to create a clock tree that achieves a good balance between clock gating and wiring capacitance based on such considerations as the amount of physical overlap between clock domain sinks and the correlation between gated clocks that may be combined. Note that the cluster 805 and the cluster 807 of the clock tree 901 still receive "pure" gated clocks (e.g., gated clock GCLK_A and GCLK_B, respectively) and the maximum power consumption reduction based on clock gating considerations.

Figure 10:
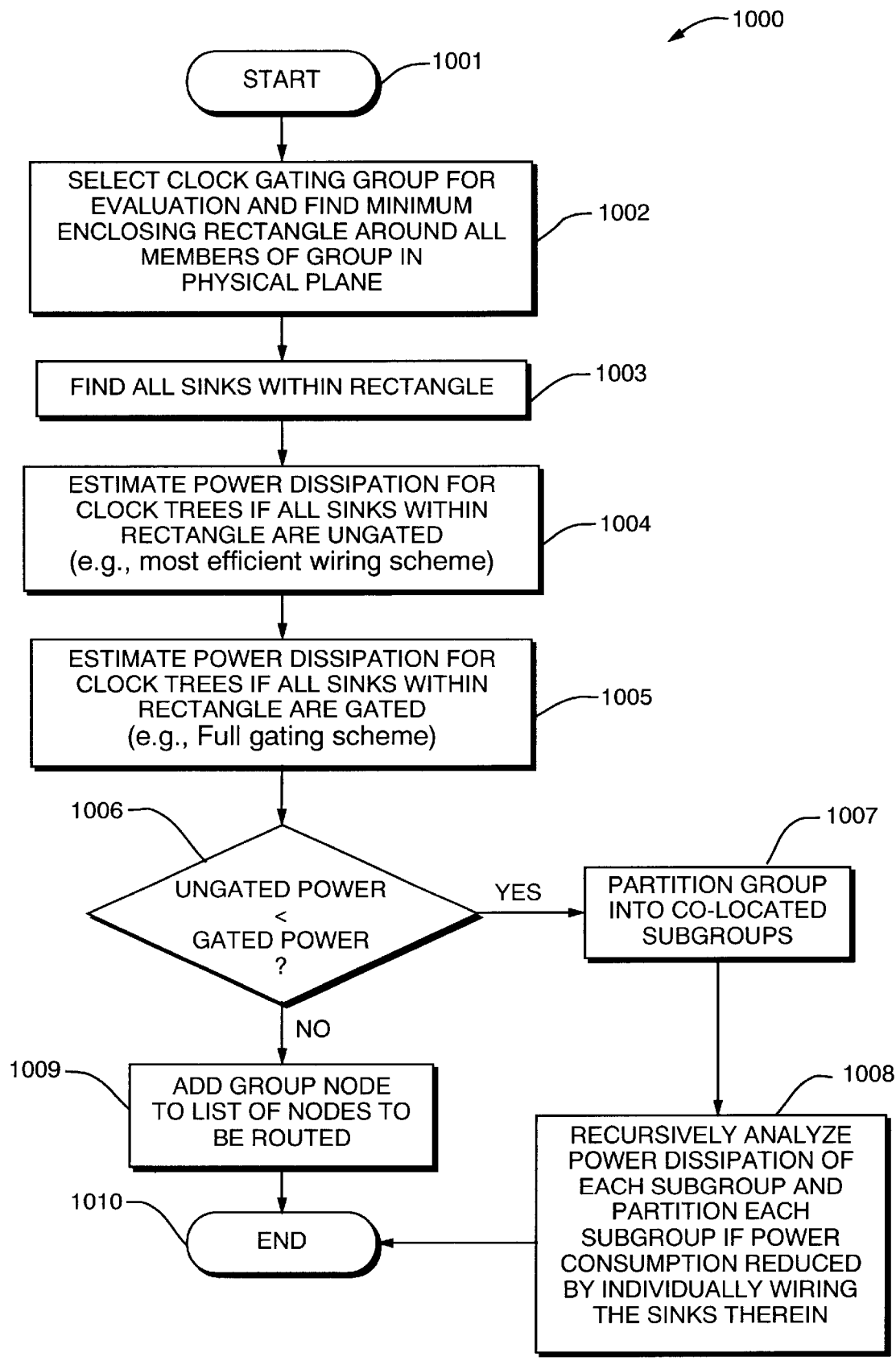
FIG. 10 is a flowchart of an inventive ungate algorithm that optimizes a clock tree design based on the physical layout of the clock tree.

FIG. 10 is a flowchart of an inventive ungate algorithm 1000 that optimizes a clock tree design based on the physical layout of the clock tree following performance of the clock gating methodology 400 of FIG. 4 (e.g., the methodology that creates clock gating groups based on logical considerations as previously described). In general, the ungate algorithm 1000 is used in conjunction with the physical design algorithm 1100 of FIG. 11 to perform a top-down analysis on the clock tree generated by the clock gating methodology 400 to decide whether to keep the clock gating groups defined therein. Specifically, the ungate algorithm 1000 (in conjunction with the physical design algorithm 1100) works on a fully built clock tree and recursively traverses the tree to break apart gating when doing so reduces the power consumption of the tree. By making gating the default within a clock tree, and by forcing the ungate algorithm 1000 to actively break apart gating groups, gating thereby tends to remain higher in the tree (e.g., closer to the root). The higher up in the tree (closer to the root) that clock gating can be maintained, the closer the physical clock gating group resembles the logical clock gating model which yields maximum gating of the clock tree. Further, by starting at the root of the tree and working toward the leaves, solutions are avoided that appears better at a lower level within the tree but which are not the best solution when the entire tree is considered (e.g., "local minimum" traps are avoided).

With reference to FIG. 10, the ungate algorithm 1000 starts in step 1001. It is assumed that a logically optimized clock gated clock tree has been generated by partitioning the sinks of the tree into clock gating groups in accordance with the clock gating methodology 400, that the clock gating signal activities have been calculated and that the physical locations for the sinks within the clock tree have been determined.

In step 1002, a clock gating group node of the clock tree (e.g., node 819 in FIG. 8) is selected for evaluation, and a minimum enclosing rectangle is defined around all members of the group within the physical plane of the clock tree (e.g., the cluster 803). In step 1003, all sinks within the minimum enclosing rectangle are located, including sinks which do not form part of the clock gating group being analyzed.

In step 1004, the power dissipation for the sinks within the minimum enclosing rectangle is analyzed assuming all of the sinks therein are wired without gating. This represents the minimum wiring capacitance configuration for the sinks within the rectangle. Thereafter, in step 1005 the power dissipation for the sinks within the minimum enclosing rectangle is analyzed assuming the sinks therein are gated in accordance with the clock gating methodology 400. This represents the full gating scheme for the sinks within the rectangle. Steps 1004 and 1005 may be performed in any order.

In step 1006, the power dissipations for the gated and ungated sink configurations are compared. If the power dissipation is reduced by individually wiring the sinks within the group being analyzed, the group is partitioned into co-located subgroups in step 1007. Thereafter, in step 1008, the power dissipation for each subgroup is recursively analyzed (e.g., is analyzed with and without gating), and if power consumption is reduced for a subgroup by individually wiring the sinks therein, the subgroup is partitioned. If desired, this process may be repeated until all subgroups have been considered. Thereafter, the analysis for the clock gating group is complete and the ungate algorithm 1000 ends in step 1010.

If in step 1006, it is determined that the power dissipation for the group being analyzed is not reduced by individually wiring the sinks within the group, the group is not partitioned. Rather, in step 1009 the node of the clock gating group being analyzed is added to the list of the nodes to be routed with a minimum-skew clock routing optimization program such as IBM's ClockDesigner tool. These tools create an optimal routing of an ungated clock tree by rearranging groups of equivalent sinks to minimize capacitance difference and thus to minimize clock skew between different groups. Clock skew is the difference in arrival times of clock nets at different latches in a clock network and is caused by differences in capacitive load and buffer drive strength of different networks. Clock skew should be minimized as it reduces the effective cycle time left to perform logical operations in a microprocessor design. Note that the node is fed with an ungated clock signal. Thereafter, the analysis for the clock gating group is complete and the ungate algorithm 1000 ends in step 1010.

Pseudocode for performing the ungate algorithm 1000 is listed below, written roughly in C code.

| | |
|---|---|
| 1 | Evaluate_Ungate {GATED (group)} |
| 2 | if size (GATED) group)) = 1 |
| 3 | add GATED (group) to NETLIST; |
| 4 | break; |
| 5 | BOX = Enclose_box (GATED (group)) |
| 6 | UNGATED_POWER = Estimate_ungated_wiring {BOX} |
| 7 | GATED_POWER = Estimate_gated_wiring {BOX} |
| 8 | if (UNGATED≦POWER < GATED_POWER) |
| 9 | Subgroups = Ungate_group {GATED (group)} |
| 10 | for (all Subgroups) |
| 11 | Evaluate_Ungate {Subgroups} |
| 12 | else |
| 13 | Add GATED (group) head node to NETLIST |

In statement 1, the ungate algorithm 1000 begins on a gated group "GATED(group)". In statements 2, 3 and 4, if the gated group contains only one sink, the group cannot be partitioned and the node associated with the group is added to the netlist of nodes for the clock tree routing. Assuming the gated group comprises more than one sink, in statement 5 the minimum enclosing rectangle "BOX" is defined for the gated group.

In statement 6 the power dissipation for the sinks within the minimum enclosing rectangle is analyzed assuming all of the sinks therein are wired without gating; and in statement 7 the power dissipation for the sinks within the minimum enclosing rectangle is analyzed assuming the sinks therein are gated in accordance with the clock gating methodology 400. In statement 8, the power dissipations for the gated and ungated sink configurations are compared. If the power dissipation is reduced by individually wiring the sinks within the group being analyzed, the group is partitioned into co-located subgroups in statement 9. Thereafter, in statements 10 and 11 the power dissipation for each subgroup is recursively analyzed, and if power consumption is reduced for a subgroup by partitioning the subgroup, the subgroup is partitioned.

If the power dissipation is not reduced by individually wiring the sinks within the group being analyzed, in statements 12 and 13 the group is not partitioned and the node of the clock gating group being analyzed is added to the netlist of the nodes for the clock routing tool being employed, with a gating buffer at the head of the node.

Figure 11:
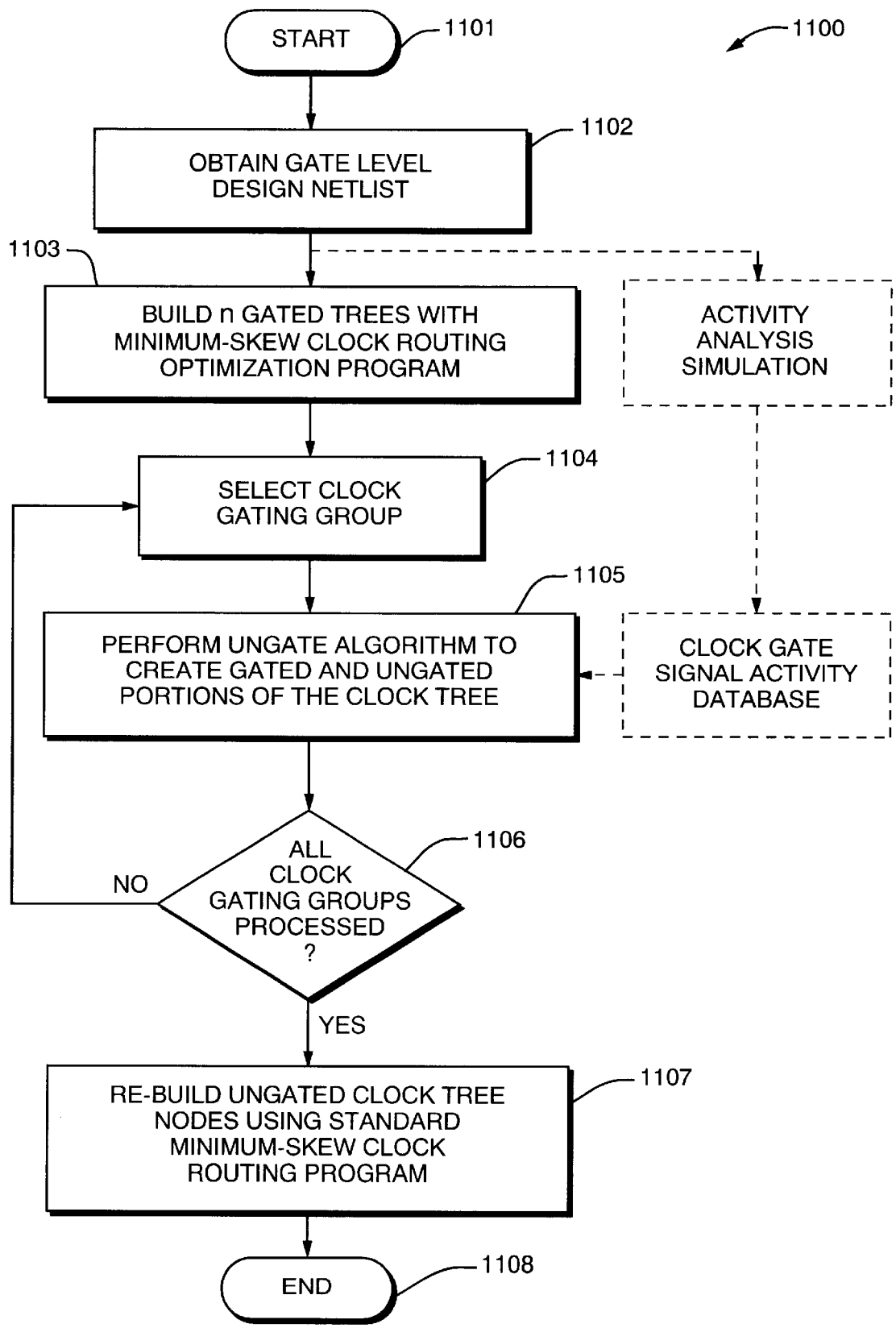
FIG. 11 is a flowchart of a physical design algorithm that operates in conjunction with the ungate algorithm of FIG. 10.

FIG. 11 is a flowchart of a physical design algorithm 1100 that operates in conjunction with the ungate algorithm 1000 of FIG. 10. The physical design algorithm 1100 performs a top-down analysis on a clock tree generated by the clock gating methodology 400 of FIG. 4 to decide whether to keep the clock gating groups defined therein based on power consumption considerations. The physical design algorithm 1100 begins in step 1101. In step 1102, the gate level design netlist for the gating optimized clock tree is obtained, and in step 1103 a minimum-skew clock routing optimization program such as IBM's ClockDesigner tool is employed to generate n gated trees (e.g., one tree per gated domain) as is known in the art.

After the n gated trees have been generated, a clock gating group within the clock tree is selected for analysis in step 1104. In step 1104, the ungate algorithm 1000 is performed on the selected clock gating group. Note that to perform the ungate algorithm 1000 (e.g., the calculation of gated versus ungated power consumption), information regarding the activity analysis of the clock tree must be known. This information was generated during execution of the clock gating methodology 400 prior to the execution of the physical design algorithm 1100 (e.g., during an activity analysis simulation of the clock tree) and may be stored within a clock gating signal activity database (not shown) for use within the physical design algorithm 1100.

In step 1105, a determination is made as to whether all clock gating groups have been analyzed within the clock tree. If not, steps 1104 and 1105 are repeated for each clock gating group within the clock tree; otherwise, in step 1107, ungated clock tree nodes (if any) are rebuilt for the clock tree design by employing a standard minimum-skew clock routing program (e.g., such as to generate the clock tree 901 of FIG. 9 from the clock tree 801 of FIG. 8). In step 1108, the physical design algorithm 1100 ends.

A major advantage of the physical design algorithm 1000 is that the netlist fed to the clock routing program is designed with advanced knowledge of the physical structure of the clock tree design so that the netlist provides for efficient wiring even when clock gating is present. In this manner, low power consumption clock trees may be designed which balance efficient wiring with the power savings due to clock gating.

Figure 12:
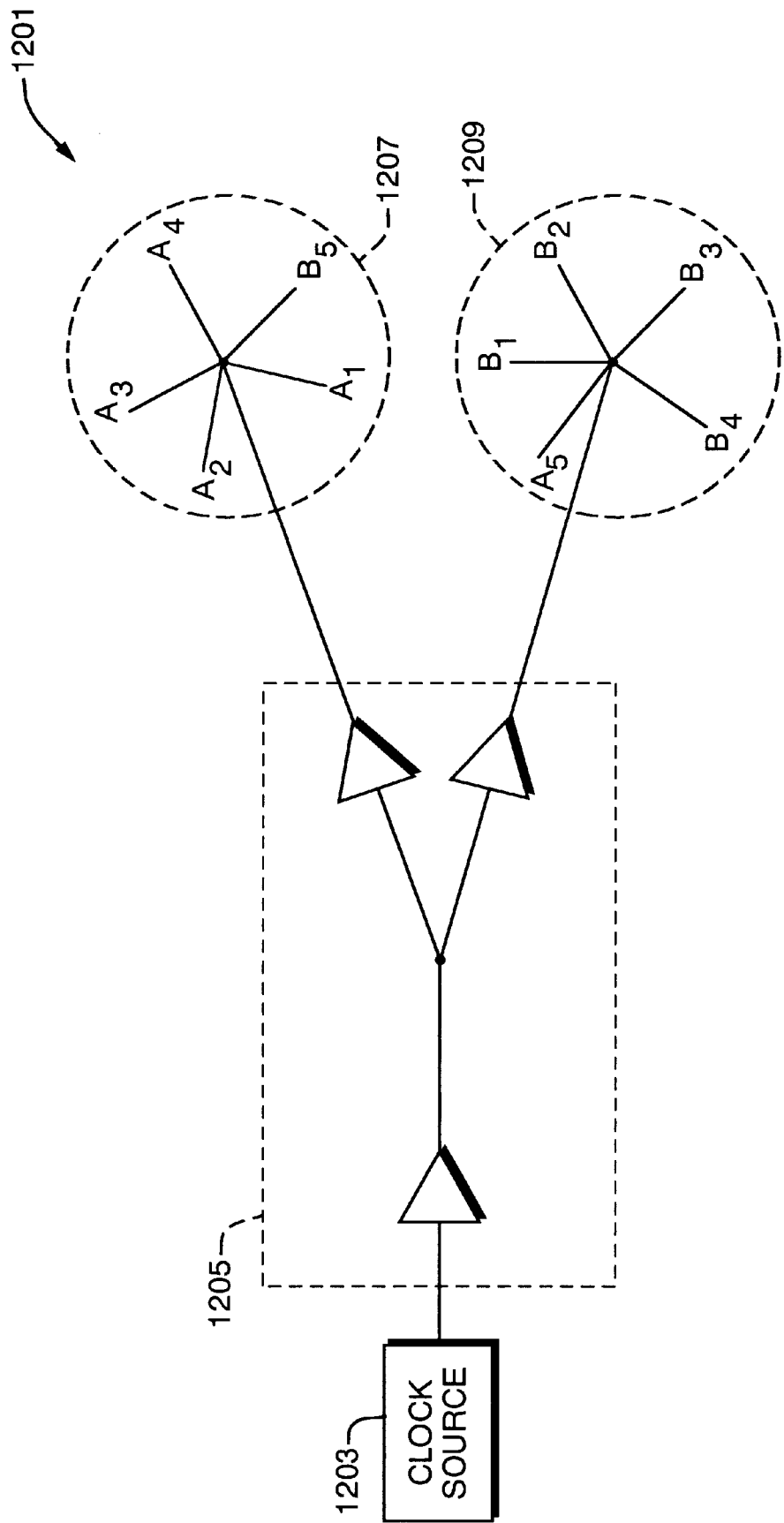
FIG. 12 is a schematic diagram of a minimum capacitance clock tree.

As an alternative to employing the inventive clock gating methodology 400 of FIG. 4, a clock tree may be built using standard techniques to achieve a minimum capacitance tree which gathers closely adjacent sinks together into a logical network to be driven by a single buffer. For example, FIG. 12 is a schematic diagram of a minimum capacitance tree 1201 that comprises two sinks, sink A and sink B, fed by a clock source 1203 and by a repowering tree 1205. The sinks are contained within a first and a second sink cluster 1207, 1209 as shown.

The minimum capacitance tree 1201 was designed using standard minimum capacitance design techniques wherein no clock-gating knowledge is employed during the clock optimization stage. Accordingly, sinks of clock gating group A and clock gating group B are mixed together to minimize wiring lengths (e.g., sinks $A_1$–$A_4$ and sink $B_5$ in cluster 1207 and sinks $B_1$–$B_4$ and sink $A_5$ in cluster 1209). However, due to the intermixing of clock gating groups, clock gating of the upper levels of the tree is prevented. The minimum capacitance tree 1201, though optimized from a capacitance standpoint, is inefficient because it prevents clock gating within the root of the tree.

Figure 13:
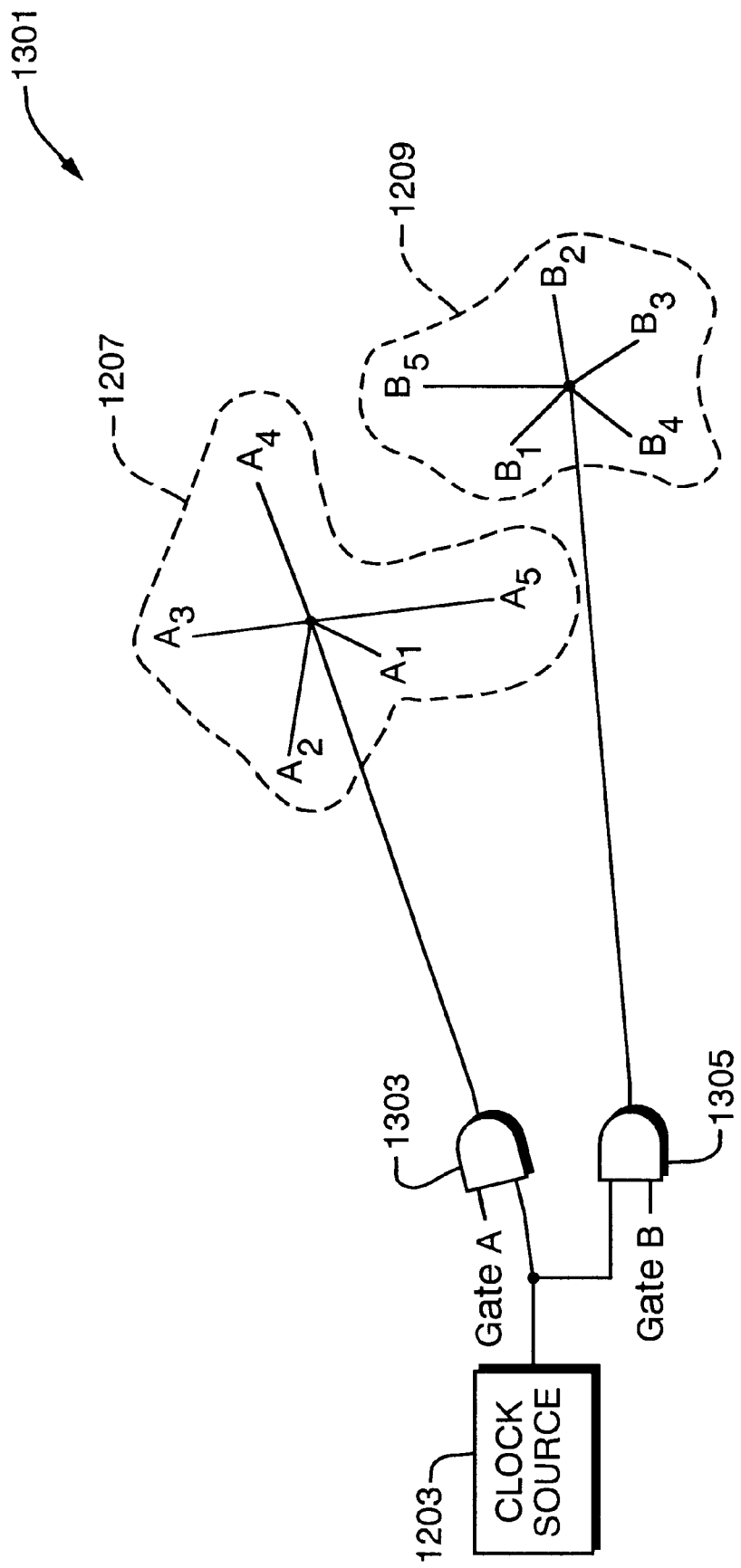
FIG. 13 is a schematic diagram of a clock tree that represents an improvement of the clock tree of FIG. 12.

FIG. 13 is a schematic diagram of a clock tree 1301 that represents an improvement of the clock tree 1201 of FIG. 12. The clock tree 1301 is generated by swapping sinks between clusters 1207 and 1209 to allow clock gating of each cluster. Specifically, sink $A_5$ from the cluster 1209 becomes part of the cluster 1207 and sink $B_5$ from the cluster 1207 becomes part of the cluster 1209. Because of the close proximity between the clusters 1207 and 1209, the "swapping" of sinks $A_5$ and $B_5$ can be performed without a significant increase in wiring length. With the cluster 1207 modified to comprise only type A sinks, the cluster 1207 may be gated via gating logic 1303. Similarly, with the cluster 1209 modified to comprise only type B sinks, the cluster 1209 may be gated via gating logic 1305. In this manner, the clock tree 1301 comprises a near-minimum capacitance clock tree having additional power savings due to gating at the root of the tree. Sink swapping can be performed by a simple sink swapping algorithm described below with reference to FIG. 14.

Figure 14:
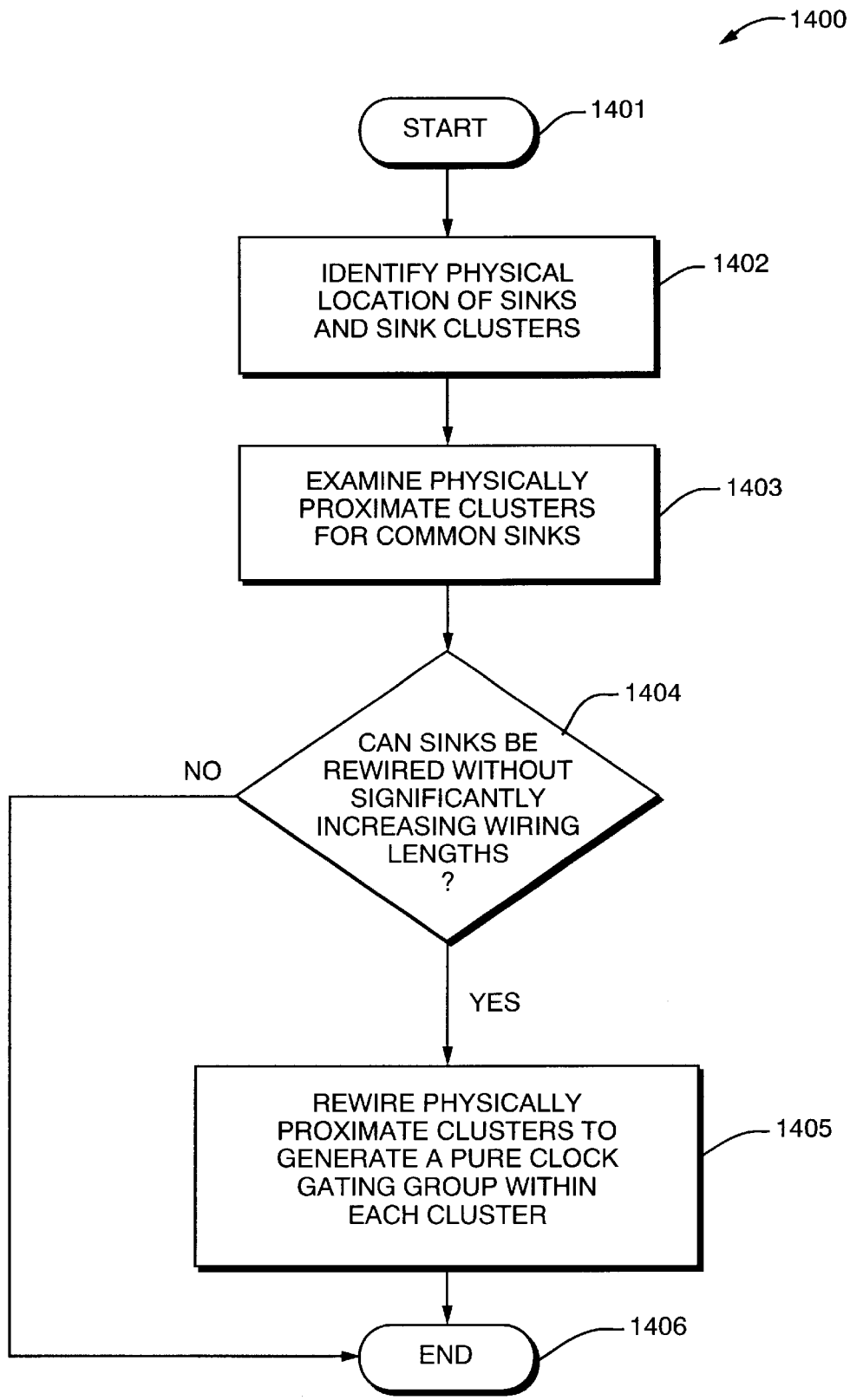
FIG. 14 is a flowchart of a sink swapping algorithm for swapping sinks between sink clusters within a minimum capacitance clock tree.

FIG. 14 is a flowchart of a sink swapping algorithm 1400 for swapping sinks between sink clusters within a minimum capacitance clock tree. The sink swapping algorithm 1400 starts in step 1401. In step 1402, the physical location of sinks and sink clusters within the clock tree are defined. Thereafter, in step 1403, physically proximate sink clusters (e.g., two clusters within a predetermined distance of each other) are examined for common sinks. In step 1404, a determination is made as to whether the sinks within the physically proximate clusters can be rewired without significantly increasing wiring lengths (e.g., without increasing capacitive power losses above a predetermined threshold). If so, in step 1405, the sinks within the physically proximate clusters are rewired to generate pure clock gating groups with each cluster (e.g., so that only sinks A are in cluster 1207 and only sinks B are in cluster 1209 of FIG. 13); and the swapping algorithm 1400 ends in step 1406. Otherwise, if in step 1404 it is determined that the sinks within the physically proximate clusters cannot be rewired without significantly increasing wiring lengths, the clusters are not rewired and the swapping algorithm 1400 ends in step 1406. Note that the swapping algorithm 1400 need not be employed only with minimum capacitance clock tree designs.

The inventive clock gating methodology 400 of FIG. 4 as well as the ungate algorithm 1000 of FIG. 10, the physical design algorithm 1100 of FIG. 11 and the sink swapping algorithm 1400 of FIG. 14 are implementable in either hardware, software or a combination thereof. In software form, the methodology and algorithms may be programmed using any suitable programming language (e.g., C, C++, Pascal, assembly language and the like), and may be implemented as a computer program product carried by a medium readable by a computer (e.g., a carrier wave signal, a floppy disc, a hard drive, a random access memory, etc.).

The foregoing description discloses only the preferred embodiments of the invention, modifications of the above disclosed apparatus and method which fall within the scope of the invention will be readily apparent to those of ordinary skill in the art. For instance, the clock gating methodology 400, the ungate algorithm 1000, the physical design algorithm 1100 and the sink swapping algorithm 1400 may be performed manually or automatically and may be employed separately and/or individually.

Accordingly, while the present invention has been disclosed in connection with the preferred embodiments thereof, it should be understood that other embodiments may fall within the spirit and scope of the invention, as defined by the following claims.

The invention claimed is:

1. A method for reducing power consumption in a clocked network, the method comprising:
   determining a correlation level between a plurality of clock gating signals and their corresponding gates which gate a source clock; and
   combining into a single clock gating signal and a single corresponding gate said plurality of clock gating signals and their corresponding gates only if a preselected level of correlation between them has been determined by the determining step.

2. The method of claim 1 wherein determining a correlation level between a plurality of clock gating signals comprises determining a percentage of time the plurality of clock gating signals are identical.

3. The method of claim 1 further comprising determining a level of usefulness of said plurality of clock gating signals and their corresponding gates, including ungating the clock source by removing at least one of said corresponding gates only if a preselected low level of usefulness has been determined.

4. The method of claim 3 wherein determining a level of usefulness of said plurality of clock gating signals comprises:
   determining an activity ratio for each clock gating signal;
   determining a latch percentage for each clock gating signal; and
   computing a usefulness ratio for each clock gating signal based on the activity ratio and the latch percentage for the clock gating signal.

5. The method of claim 3 wherein determining a level of usefulness of said plurality of clock gating signals comprises:
   determining an average gating length for each clock gating signal;
   determining a latch percentage for each clock gating signal; and
   computing a usefulness ratio for each clock gating signal based on the average gating length and the latch percentage for the clock gating signal.

6. The method of claim 1 further comprising:
   determining an area overlap of a plurality of sinks each driven by one of at least two gated drivers which, in turn, are driven by at least a portion of said plurality of clock "driven" gating signals and their corresponding gates, including removing one of the gated drivers and connecting its sinks to another one of said at least two gated drivers; and
   said another one of said at least two gated drivers driven by said single clock gating signal and the single corresponding gate.

7. The method of claim 1 further comprising:
   identifying the location of sinks and sink clusters within the clock network;
   examining physically proximate sink clusters for common sinks; and
   re-wiring physically proximate sink clusters to generate a pure clock gating group within each sink cluster if re-wiring increases wiring length by less than a predetermined amount.

8. The method of claim 1 further comprising:
   (a) selecting a clock gating group of the clock network;
   (b) computing a power dissipation for all sinks within the selected clock gating group assuming all the sinks therein are wired without clock gating;
   (c) computing a power dissipation for all sinks within the selected clock gating group assuming all the sinks therein are gated; and
   (d) ungating the clock gating group if the power dissipation for all sinks within the selected clock gating group is reduced by individually wiring the sinks within the clock gating group.

9. The method of claim 8 further comprising repeating (a)–(d) for each clock gating group within the clock network.

10. The method of claim 8 wherein selecting a clock gating group comprises defining a minimum enclosing rectangle around all members of the clock gating group within a physical plane of the clock network.

11. The method of claim 10 wherein computing power dissipation for all sinks within the selected clock gating group with and without clock gating comprises computing power dissipation for all sinks within the minimum enclosing rectangle with and without clock gating.

12. The method of claim 8 wherein ungating the clock gating group comprises partitioning the clock gating group into subgroups.

13. The method of claim 12 further comprising:

analyzing a power dissipation for each subgroup with and without clock gating; and partitioning each subgroup if the power dissipation for the subgroup is reduced by individually wiring each sink therein.

14. A method for reducing power consumption in a clocked network, the method comprising:

determining a proximity and domain relationship of a sink to a plurality of nearby gated buffers; and disconnecting the sink from its current gated buffer and connecting it to another gated buffer if the sink and said another gated buffer are in the same clock domain and the distance between them is less than a preselected distance.

15. A computer program product for use in designing a clock network, the computer program product comprising:

a medium readable by a computer, the computer readable medium having:

means for determining a correlation level between a plurality of clock gating signals and their corresponding gates which gate a source clock; and means for combining into a single clock gating signal and a single corresponding gate said plurality of clock gating signals and their corresponding gates only if a preselected level of correlation between them has been determined by the determining step.

16. The computer program product of claim 15 wherein the means for determining a correlation level between a plurality of clock gating signals comprises means for determining a percentage of time the plurality of clock gating signals are identical.

17. The computer program product of claim 15 further comprising means for determining a level of usefulness of said plurality of clock gating signals and their corresponding gates, including means for ungating the clock source by removing at least one of said corresponding gates only if a preselected low level of usefulness has been determined.

18. The computer program product of claim 17 wherein the means for determining a level of usefulness of said plurality of clock gating signals comprises:

means for determining an activity ratio for each clock gating signal;

means for determining a latch percentage for each clock gating signal; and means for computing a usefulness ratio for each clock gating signal based on the activity ratio and the latch percentage for the clock gating signal.

19. The computer program product of claim 17 wherein the means for determining a level of usefulness of said plurality of clock gating signals comprises:

means for determining an average gating length for each clock gating signal;

means for determining a latch percentage for each clock gating signal; and means for computing a usefulness ratio for each clock gating signal based on the average gating length and the latch percentage for the clock gating signal.

20. The computer program product of claim 15 further comprising means for determining an area overlap of a plurality of sinks each driven by one of at least two gated drivers which, in turn, are driven by at least a portion of said plurality of clock "driven" gating signals and their corresponding gates, including means for removing one of the gated drivers and for connecting its sinks to another one of said at least two gated drivers; and said another one of said at least two gated drivers driven by said single clock gating signal and the single corresponding gate.

21. The computer program product of claim 15 further comprising:

means for identifying the location of sinks and sink clusters within the clock network;

means for examining physically proximate sink clusters for common sinks; and means for re-wiring physically proximate sink clusters to generate a pure clock gating group within each sink cluster if re-wiring increases wiring length by less than a predetermined amount.

22. The computer program product of claim 15 further comprising means for:

(a) selecting a clock gating group of the clock network;

(b) computing a power dissipation for all sinks within the selected clock gating group assuming all the sinks therein are wired without clock gating;

(c) computing a power dissipation for all sinks within the selected clock gating group assuming all the sinks therein are gated; and (d) ungating the clock gating group if the power dissipation for all sinks within the selected clock gating group is reduced by individually wiring the sinks within the clock gating group.

23. The computer program product of claim 22 further comprising means for repeating (a)–(d) for each clock gating group within the clock network.

24. The computer program product of claim 22 wherein the means for selecting a clock gating group comprises means for defining a minimum enclosing rectangle around all members of the clock gating group within a physical plane of the clock network.

25. The computer program product of claim 24 wherein the means for computing power dissipation for all sinks within the selected clock gating group with and without clock gating comprises means for computing power dissipation for all sinks within the minimum enclosing rectangle with and without clock gating.

26. The computer program product of claim 22 wherein the means for ungating the clock gating group comprises means for partitioning the clock gating group into subgroups.

27. The computer program product of claim 26 further comprising:

means for analyzing a power dissipation for each subgroup with and without clock gating; and means for partitioning each subgroup if the power dissipation for the subgroup is reduced by individually wiring each sink therein.

28. A computer program product for use in designing a clock network, the computer program product comprising:

a medium readable by a computer, the computer readable medium having:

means for determining a proximity and domain relationship of a sink to a plurality of nearby gated buffers of the clock network; and means for disconnecting the sink from its current gated buffer and connecting it to another gated buffer if the sink and said another gated buffer are in the same clock domain and the distance between them is less than a preselected distance.

* * * * *